US009343540B2

(12) United States Patent
Dhar et al.

(10) Patent No.: US 9,343,540 B2
(45) Date of Patent: May 17, 2016

(54) TRANSISTORS WITH A GATE INSULATION LAYER HAVING A CHANNEL DEPLETING INTERFACIAL CHARGE

(71) Applicant: Cree, Inc., Durham, NC (US)

(72) Inventors: Sarit Dhar, Auburn, AL (US); Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/460,203

(22) Filed: Aug. 14, 2014

(65) Prior Publication Data

US 2015/0325655 A1 Nov. 12, 2015

Related U.S. Application Data

(62) Division of application No. 12/548,763, filed on Aug. 27, 2009, now Pat. No. 8,841,682.

(51) Int. Cl.
*H01L 29/16* (2006.01)
*H01L 29/78* (2006.01)
(Continued)

(52) U.S. Cl.
CPC ...... *H01L 29/66068* (2013.01); *H01L 29/1033* (2013.01); *H01L 29/1608* (2013.01);
(Continued)

(58) Field of Classification Search
CPC ......... H01L 29/16; H01L 29/78; H01L 29/10; H01L 29/51; H01L 29/36
USPC ...................... 257/77, 324, 321, 347, 59, 219; 438/285, 478, 261, 263, 264
See application file for complete search history.

(56) References Cited

U.S. PATENT DOCUMENTS

| 5,612,260 A | 3/1997 | Palmour |
| 5,972,801 A * | 10/1999 | Lipkin et al. ................. 438/770 |

(Continued)

FOREIGN PATENT DOCUMENTS

| EP | 0 436 184 A2 | 7/1991 |
| GB | 2 028 582 A | 3/1980 |
| JP | 3-190230 | 8/1991 |

OTHER PUBLICATIONS

Notification of Transmittal of the International Search Report and The Written Opinion of the International Searching Authority, or the Declaration; International Search Report and Written Opinion of the International Searching Authority corresponding to International application No. PCT/US2010/039439; Mail date: Oct. 13, 2010; 15 pages.

(Continued)

*Primary Examiner* — Sheng Zhu
(74) *Attorney, Agent, or Firm* — Myers Bigel & Sibley, P.A.

(57) ABSTRACT

A metal-insulator-semiconductor field-effect transistor (MISFET) includes a SiC layer with source and drain regions of a first conductivity type spaced apart therein. A first gate insulation layer is on the SiC layer and has a net charge along an interface with the SiC layer that is the same polarity as majority carriers of the source region. A gate contact is on the first gate insulation layer over a channel region of the SiC layer between the source and drain regions. The net charge along the interface between the first gate insulation layer and the SiC layer may deplete majority carriers from an adjacent portion of the channel region between the source and drain regions in the SiC layer, which may increase the threshold voltage of the MISFET and/or increase the electron mobility therein.

10 Claims, 8 Drawing Sheets

(51) Int. Cl.
  *H01L 29/10* (2006.01)
  *H01L 29/51* (2006.01)
  *H01L 29/36* (2006.01)
  *H01L 29/66* (2006.01)
(52) U.S. Cl.
  CPC ............... *H01L29/36* (2013.01); *H01L 29/51* (2013.01); *H01L 29/513* (2013.01); *H01L 29/518* (2013.01); *H01L 29/78* (2013.01)

(56) References Cited

U.S. PATENT DOCUMENTS

| | | | |
|---|---|---|---|
| 6,043,536 A * | 3/2000 | Numata et al. | 257/347 |
| 6,184,562 B1 | 2/2001 | Kemmer et al. | |
| 6,573,534 B1 | 6/2003 | Kumar et al. | |
| 6,617,653 B1 | 9/2003 | Yokogawa et al. | |
| 6,630,382 B1 | 10/2003 | Thornton | |
| 6,639,273 B1 | 10/2003 | Ueno | |
| 6,897,523 B2 * | 5/2005 | Ueno et al. | 257/324 |
| 6,902,964 B2 * | 6/2005 | Sriram | 438/167 |
| 6,974,720 B2 | 12/2005 | Sumakeris et al. | |
| 7,170,044 B2 | 1/2007 | Pakr et al. | |
| 7,265,388 B2 | 9/2007 | Fukuda et al. | |
| 7,338,869 B2 | 3/2008 | Fukuda et al. | |
| 7,388,785 B2 * | 6/2008 | Furnemont | 365/185.18 |
| 2002/0153594 A1 | 10/2002 | Lipkin et al. | |
| 2007/0132011 A1 * | 6/2007 | Kato | 257/324 |
| 2008/0017936 A1 | 1/2008 | Buchanan et al. | |
| 2008/0146004 A1 * | 6/2008 | Matocha et al. | 438/478 |
| 2008/0203441 A1 | 8/2008 | Endo | |

OTHER PUBLICATIONS

International Preliminary Report on Patentability, PCT Application No. 2010/039439, Sep. 14, 2011.
Notification of Reason(s) for Refusal with English language translation, JP Application No. 2012-526750, Aug. 26, 2013.
Hatayama et al. "Remarkable Increase in the Channel Mobility of SiC-MOSFETs by Controlling the Interfacial $SiO_2$ Layer between the $Al_2O_3$ and SiC" *IEEE Transactions on Electron Devices* 55(8):2041-2045 (2008).
Hertkorn et al. "Highly Conductive Modulation-Doped Graded p-AlGaN/(AlN)/GaN Multi-Heterostructures" *Annual Report 2007, Institute of Optoelectronics, Ulm University* 59-66 (2007).
Hijikata et al., "Characterization of oxide films on 4H-Sic epitaxial (0001) faces by high-energy-resolution photoemission spectroscopy: Comparison between wet and dry oxidation"; Journal of Applied Physics100, 053710 (2006), 7 pages.
Okamoto et al., "Lateral RESURF MOSFET Fabricated on 4H-SiC (0001) C-Face"; IEEE Electron Device Letters, vol. 25, No. 6, Jun. 2004, XP-002600893, pp. 405-407.

* cited by examiner

TRANSISTORS WITH A GATE INSULATION LAYER HAVING A CHANNEL DEPLETING INTERFACIAL CHARGE

CROSS-REFERENCE TO RELATED APPLICATION

The present application is a divisional of U.S. patent application Ser. No. 12/548,763, filed Aug. 27, 2009, assigned to the assignee of the present application, the disclosure and content of which is incorporated by reference herein in its entirety.

STATEMENT OF GOVERNMENT INTEREST

The present invention was made with support from the Department of the Army, contract number W911NF-04-2-0021. The Government has certain rights in this invention.

FIELD OF THE INVENTION

The present invention relates to microelectronic devices and more particularly to transistors, for example, metal-insulator-semiconductor field-effect transistors (MISFETs) and related fabrication processes.

BACKGROUND

Power semiconductor devices are widely used to regulate large current, high voltage, and/or high frequency signals. Modern power devices are generally fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening silicon dioxide insulator. Current conduction occurs via transport of majority carriers, without the presence of minority carrier injection that is used in bipolar transistor operation.

MOSFETS can be formed on a silicon carbide (SiC) layer. Silicon carbide (SiC) has a combination of electrical and physical properties that make it attractive as a semiconductor material for high temperature, high voltage, high frequency and/or high power electronic circuits. These properties include a 3.2 eV bandgap, a 4 MV/cm electric field breakdown, a 4.9 W/cm-K thermal conductivity, and a $2.0 \times 10^7$ cm/s electron drift velocity.

Consequently, these properties may allow silicon carbide-based MOSFET power devices to operate at higher temperatures, higher power levels, higher frequencies (e.g., radio, S band, X band), and/or with lower specific on-resistance than silicon-based MOSFET power devices. A power MOSFET fabricated in silicon carbide is described in U.S. Pat. No. 5,506,421 to Palmour entitled "Power MOSFET in Silicon Carbide" and assigned to the assignee of the present invention.

Increasing the electron mobility of silicon carbide-based MOSFETs may improve their power and frequency operational characteristics. Electron mobility is the measurement of how rapidly an electron is accelerated to its saturation velocity in the presence of an electric field. Semiconductor materials which have a high electron mobility are typically preferred because more current can be driven with a lower field, resulting in faster response times when a field is applied.

SUMMARY

In accordance with some embodiments, a metal-insulator-semiconductor field-effect transistor (MISFET) includes a SiC layer with source and drain regions of a first conductivity type spaced apart therein. A first gate insulation layer is on the SiC layer and has a net charge along an interface with the SiC layer that is the same polarity as majority carriers of the source region. A gate contact is on the first gate insulation layer over a channel region of the SiC layer between the source and drain regions.

The net charge along the interface between the first gate insulation layer and the SiC layer may deplete majority carriers from an adjacent portion of the channel region between the source and drain regions in the SiC layer, which may increase the threshold voltage of the MISFET.

Fabrication of a metal-insulator-semiconductor field-effect transistor (MISFET) can include providing a SiC layer having source and drain regions of a first conductivity type spaced apart therein. A first gate insulation layer is formed on the SiC layer that has a net charge along an interface with the SiC layer that is the same polarity as majority carriers of the source region. A gate contact on the first gate insulation layer is provided over a channel region of the SiC layer between the source and drain regions.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

The invention is described more fully herein after with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" or "upper" or "top" or "lateral" or "vertical" may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the present invention are directed toward MISFET devices and related processes for fabricating MISFET devices, and which may result in increasing the threshold voltage at which MISFET devices turn-on and/or increasing the electron mobility of MISFET devices.

Figure 1:
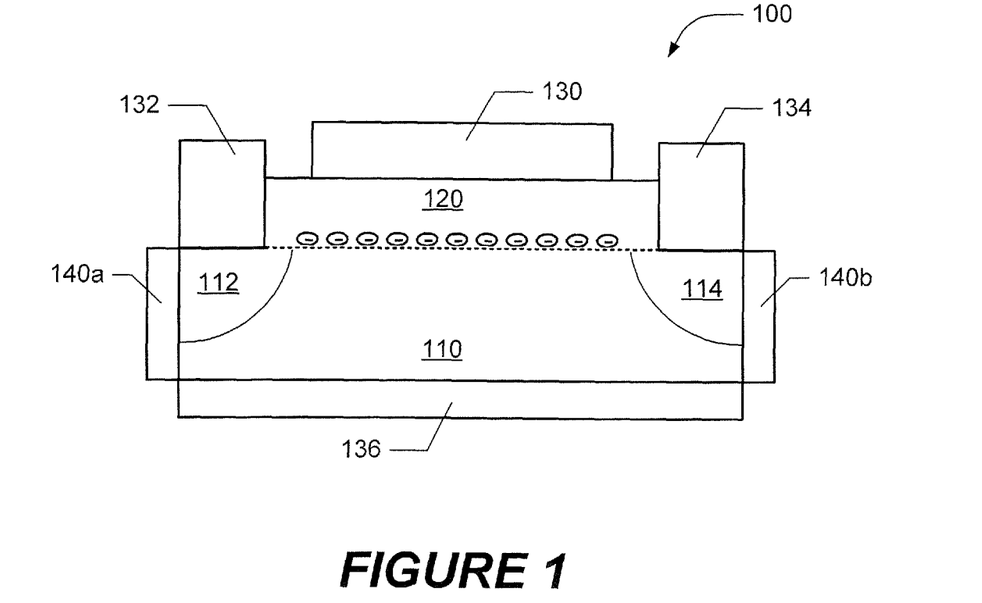
FIG. 1 is a cross-sectional view of a MISFET having a SiC layer with source and drain regions and a negative interfacial charge containing $SiO_2$ gate insulation layer that is on the SiC layer in accordance with some embodiments of the present invention.

FIG. 1 is a cross-sectional view of a MISFET 100 that is configured in accordance with some embodiments of the present invention. Referring to FIG. 1, the MISFET 100 includes a SiC layer 110. The SiC layer 110 may, for example, be a $5 \times 10^{15}$ cm$^{-3}$ P-type C-face (carbon-face) 4H—SiC substrate. SiC substrates are available from Cree Inc., Durham, N.C. A n+ source region 112 and a n+ drain region 114 are formed on the C-face of the SiC layer 110 and are spaced apart. A channel region extends between the source region 112 and the drain region 114. A gate contact 130 is aligned over the channel region and may partially overlap the source region 112 and the drain region 114. A gate insulating layer 120 separates the gate contact 130 from the SiC layer 110. A source contact 132 contacts the source region 112 and a drain contact 134 contacts the drain region 114. A body contact 136 is on an opposite surface of the SiC layer 110 from the gate contact 130. The source contact 132, the drain contact 134, and/or the body contact 136 may include nickel or another suitable metal. The MISFET 100 may be isolated from adjacent devices on the SiC layer 110 by isolation regions 140a-b (e.g., shallow trench isolation regions).

The threshold voltage at which the MISFET 100 turns-on may be increased by providing a gate insulation layer 120 on the SiC layer 110 that has a net charge (e.g., the negative charge symbols in FIG. 1) along an interface with the SiC layer 110 that is the same polarity as majority carriers of the source region 112. The net interfacial charge may thereby deplete charge carriers from the adjacent channel region and increase the threshold voltage of the MISFET 100.

The net charge can be created along the interface between a gate insulation layer 120 and a carbon face of the SiC layer 110. Some embodiments of the present invention may arise from the present realization that a negative charge can be generated by forming a silicon dioxide layer on a SiC layer, and that the net charge can be increased by increasing the amount of carbon atoms present along the crystal face of the SiC layer contacting the silicon dioxide layer. In particular, a silicon dioxide layer can be formed on a carbon face (e.g., substantially free of Si atoms along the face) SiC layer to provide a net charge that is sufficiently strong to deplete majority charge carriers from an adjacent channel region of the SiC layer.

The silicon dioxide gate insulation layer 120 may be formed by thermally oxidizing a surface of the SiC layer 110 and/or by depositing or otherwise providing a silicon dioxide layer on the channel region and heating the structure to form the interfacial charge therebetween. For example, the gate insulating layer 120 may be formed from silicon dioxide that is heated to react with the SiC layer to form the interfacial charge therebetween. In contrast, when the silicon dioxide gate insulation layer 120 is formed by oxidizing the SiC layer 110, a second gate insulating layer 120 may be formed from, for example, silicon nitride and/or silicon oxynitride on the silicon dioxide gate insulation layer 120 to increase the insulation between the gate contact 130 and the SiC layer 110. In some exemplary embodiments, a region along the interface between the gate insulation layer and the SiC layer that provides the net charge has a thickness no greater than 50 Å. These and other processes that may be used to form the a gate insulation layer having a net negative interfacial charge along the SiC layer 110 are further described below with regard to FIGS. 6-17.

Figure 2:
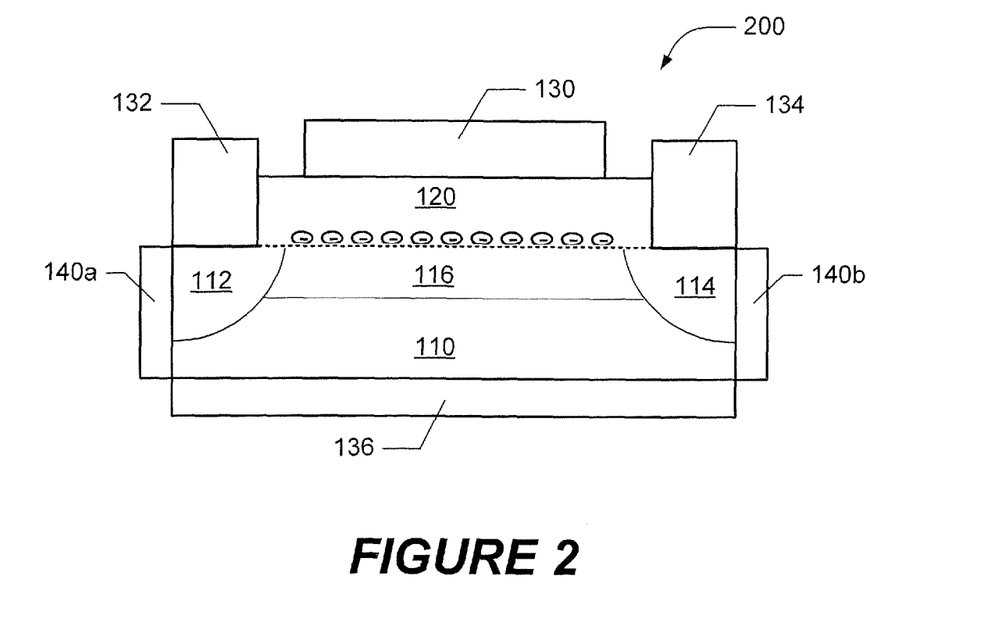
FIG. 2 is a cross-sectional view of a MISFET with a negative interfacial charge containing $SiO_2$ over a doped channel region of a SiC layer in accordance with some embodiments of the present invention.

FIG. 2 is a cross-sectional view of another MISFET 200 that is configured in accordance with some embodiments of the present invention. The MISFET 200 of FIG. 2 may be substantially the same as the MISFET 100 of FIG. 1 except for the addition of a doped channel region 116 that extends between the source region 112 and the drain region 114. Referring to FIG. 2, when the source region 112 and the drain region 114 are n+ regions, the doped channel region 116 can be n-type.

The electron mobility of the channel region 116 may be increased by increasing its dopant concentration and/or by increasing the channel thickness (vertical direction in FIG. 2), which can decrease its electrical resistance and correspondingly increase its current capacity. However, the level of increase in electron mobility that can be achieved through channel doping and/or increasing thickness of the channel region 116 can be constrained by a requirement for the MISFET 200 to turn off with a very low (preferably zero) drain leakage current when the voltage potential between the gate contact 130 and the source region 112 ($V_{GS}$) is less than a defined threshold voltage.

The interface between the gate insulation layer 120 and the SiC layer 110 has a net charge that is the same polarity as majority carriers of the doped channel region 116, and biases charge carriers away from an adjacent portion of the doped channel region 116. Accordingly, in FIG. 2, the net negative charge (e.g., the negative charge symbols in FIG. 2) that has the same polarity as the majority charge carriers (e.g., electrons) in the doped channel region 116, and which, thereby, depletes the majority charge carriers (e.g., electrons) from at least an adjacent portion of the doped channel region 116 when the gate to source voltage ($V_{GS}$) is zero. The doped channel region 116 may therefore be fabricated to have a higher n-type dopant concentration and/or to have a greater thickness so as to provide higher mobility in the doped channel region 116 and/or to provide increased channel current capacity while allowing the MISFET 200 to turn off when $V_{GS}$ is less than the threshold voltage. The net fixed charge provided by the SiO$_2$ gate insulation layer 120 may alternatively or additionally be used to increase the threshold voltage of the MISFET 200.

The net negative charge per unit area may be regulated through the manufacturing processes to provide a value that is at least as high as a net charge generated by dopants in an adjacent unit area of the doped channel region 116. Thus, for example, a product of the doping concentration and thickness of the doped channel region 116 should be equal to or less than the amount of negative fixed charge per unit area provided by the SiO$_2$ gate insulation layer 120, as defined by the following Equation 1:

$$N\_channel \times n\_channel \leq Ng. \quad \text{(Equation 1)}$$

In Equation 1, the term "N_channel" represents the n-type dopant concentration (e.g., cm$^{-3}$) of the doped channel region 116, the term "n_channel" represents the thickness (e.g., cm) of the doped channel region 116, and the term "Ng" represents the negative fixed charge density (cm$^{-2}$) provided by the SiO$_2$ gate insulation layer 120.

In some embodiments, the doped channel region 116 may have a n-type dopant concentration from about $1 \times 10^{16}$ cm$^{-3}$ to about $1 \times 10^{18}$ cm$^{-3}$ and a thickness from about 0.1 µm to about $0.5 \times 10^{-5}$ µm. Thus, according to Equation 1, the fixed negative charge provided by the SiO$_2$ gate insulation layer 120 may be configured to generate a net charge density that is in a range from about $-3 \times 10^{11}$ cm$^{-2}$ to about $-6 \times 10^{13}$ cm$^{-2}$. The source and drain regions 112 and 114 each have a n-type dopant concentration that is greater than the n-type dopant concentration of the doped channel region 116, and may, for example, have a n-type dopant concentration from about $1 \times 10^{19}$ cm$^{-3}$ to about $1 \times 10^{21}$ cm$^{-3}$.

As used herein, "p-type", "p+", "n-type", and "n+" refer to regions that are defined by higher carrier concentrations than are present in adjacent or other regions of the same or another layer or substrate. Although various embodiments are described herein in the context of n-type MISFETs that include n-type channel, n+ source, and n+ drain regions on a SiC layer, according to some other embodiments p-type MISFETs structures are provided that include p-type channel, p+ source, and p+ drain regions on a SiC layer. For p-type MISFETs, the gate insulation layer can be configured to provide a fixed positive charge along a surface facing a channel region that depletes charge carriers (e.g., holes) from at least an adjacent portion of the channel region when a zero voltage potential is present between the gate contact 130 and the source region 112.

Various exemplary operational characteristics that may be provided when the MISFET 200 shown in FIG. 2 is in an off state, in a partially-on state, and in a fully-on state will now be described with reference to FIGS. 3-5.

Figure 3:
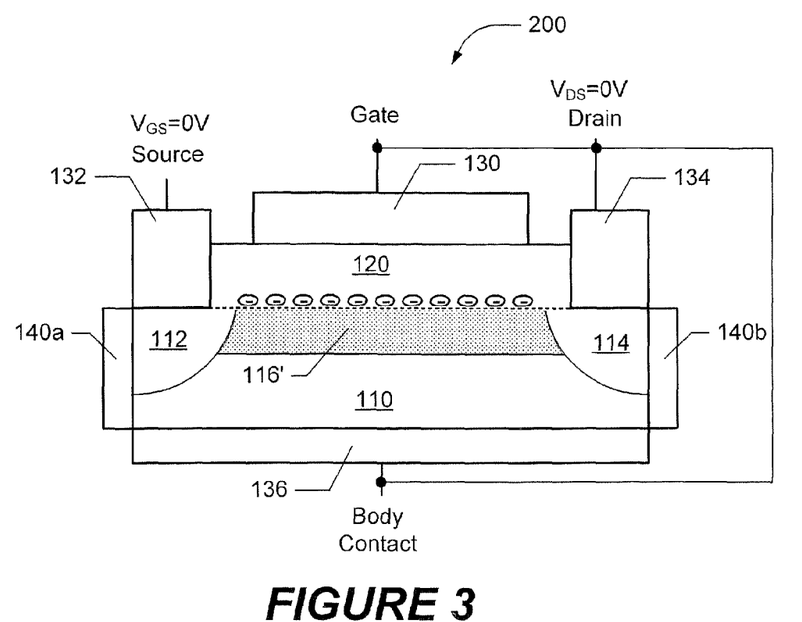
FIG. 3 is a cross-sectional view of the MISFET of FIG. 2 with a negative interfacial charge containing $SiO_2$ layer that depletes and pinches-off the doped channel region when a zero voltage is present between a gate contact and a source region in accordance with some embodiments of the present invention.

FIG. 3 is a cross-sectional view of the MISFET 200 of FIG. 2 when zero voltage is present between the gate contact 130 and the source contact 132, and the gate contact 130, the drain contact 134, and the body contact 136 are electrically connected. The fixed negative charge along the interface between the gate insulation layer 120 and the SiC layer 110 causes the channel region 116' to be effectively depleted of charge carriers and, therefore, pinched off. Consequently, very little (if any) current should flow through the drain contact 134.

Figure 4:
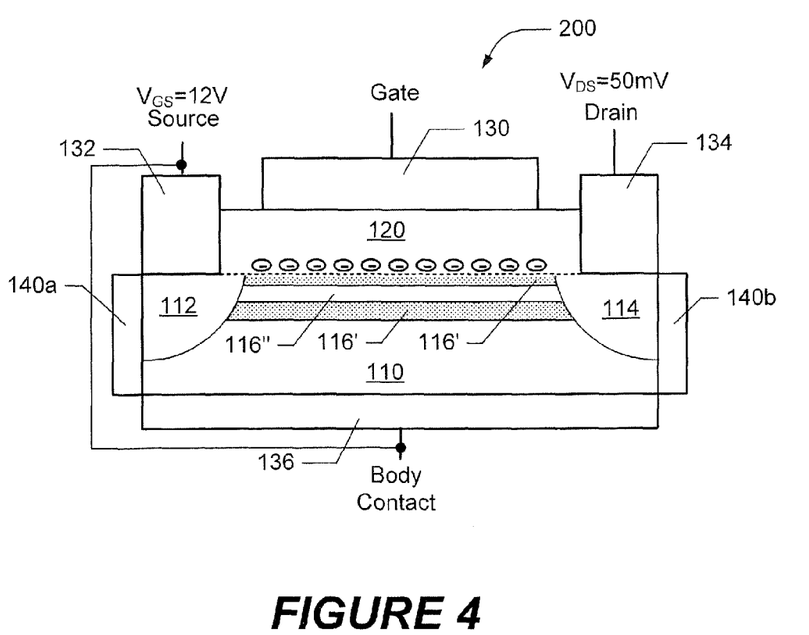
FIG. 4 is a cross-sectional view of the MISFET of FIG. 2 with a threshold voltage applied between the gate contact and the source region that induces conduction through the undepleted part of the channel region and thereby cause a low current flow through a drain contact in accordance with some embodiments of the present invention.

FIG. 4 is a cross-sectional view of the MISFET 200 when 12V (the threshold voltage for the MISFET 200) is applied between the gate contact 130 and the source contact 132 ("$V_{GS}$"), and when the source contact 132 and the body contact 136 are electrically connected. Applying 12 $V_{GS}$ causes the depletion region 116' to recede from a central region of the channel region 116 because many of the negative charges provided by the CSiO$_2$ depletion layer 150 are mirrored in the body contact 136, which thereby forms a centrally located undepleted charge carrier region 116". Consequently, a current can flow through the centrally located undepleted charge carrier region 116" to the drain contact 134.

Figure 5:
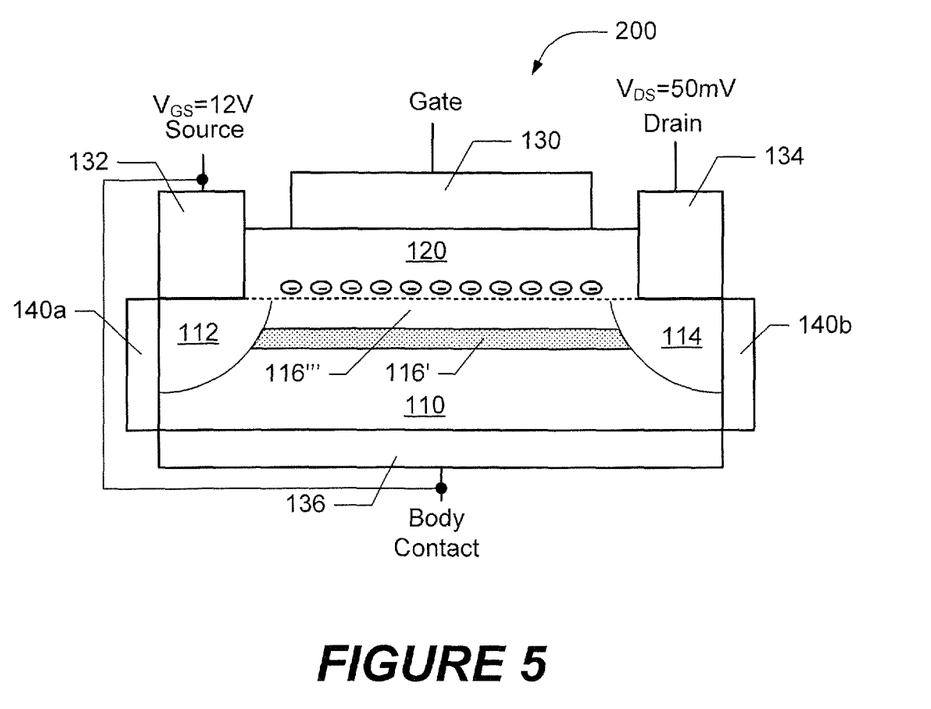
FIG. 5 is a cross-sectional view of the MISFET of FIG. 1 with a voltage, which is substantially higher than the threshold voltage, that is applied between the gate contact and the source region to induce conduction through at least a majority of the channel region and cause a high current through the drain contact in accordance with some embodiments of the present invention.

FIG. 5 is a cross-sectional view of the MISFET 200 when 25V is applied between the gate contact 130 and the source contact 132, and when the source contact 132 and the body contact 136 are electrically connected. The 25 $V_{GS}$ potential causes the undepleted charge carrier region 116''' to extend upward to the surface of the channel region 116. Consequently, a much higher current can flow through the undepleted charge carrier region 116''' to the drain contact 134.

Figure 6:
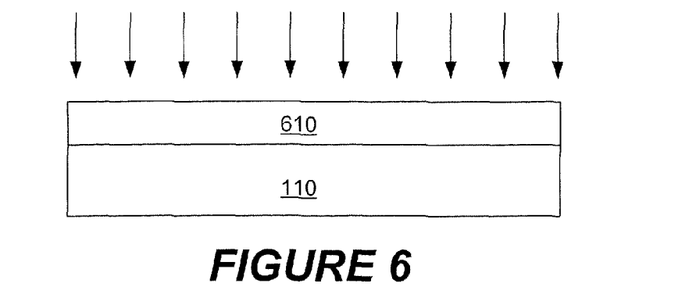
FIGS. 6-12 are a sequence of cross-sectional views of processes for fabricating the MISFET of FIG. 2 in accordance with some embodiments of the present invention.

FIGS. 6-12 are a sequence of cross-sectional views of processes that may be carried out to fabricate the MISFET 200 of FIG. 2 in accordance with some embodiments of the present invention. Referring to FIG. 6, a SiC layer 110 is provided. A n-type layer 610 is formed in the SiC layer 110 by implanting n-type dopants (e.g., nitrogen and/or phosphorous atoms) at a concentration from about $1 \times 10^{16}$ cm$^{-3}$ to about $1 \times 10^{18}$ cm$^{-3}$ and to a depth from about 0.1 µm to about $0.5 \times 10^{-5}$ µm in the SiC layer 110.

Figure 7:
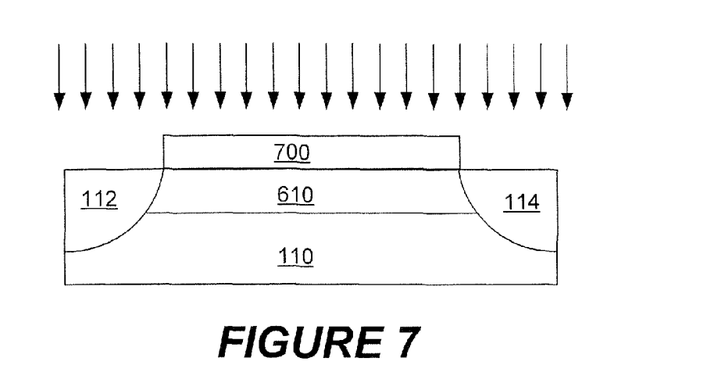

Referring to FIG. 7, a mask pattern 700 is formed on a portion of the n-type layer 610 that will become the doped channel region 116. Further n-type dopants are implanted into the SiC layer 110 to form the n+ source region 112 and the n+ drain region 114 with an n-type dopant concentration from about $1 \times 10^{19}$ cm$^{-3}$ to about $1 \times 10^{21}$ cm$^{-3}$. The implanted dopants may be annealed at a temperature from about 1300° C. to about 2000° C. to form the channel region 116, the source region 112, and the drain region 114. The mask pattern 700 can be removed before or after the annealing.

The depth and concentration of the dopants that are implanted into the channel region 116 depend upon the quantity of fixed negative charge that will be provided by the subsequently formed $SiO_2$ gate insulation layer 120. As explained above, a product of the doping concentration and thickness of the channel region 116 should be equal to or less than the amount of negative fixed charge provided along the interface between the gate insulation layer 120 and the SiC layer 110 in accordance with some embodiments.

Figure 8:
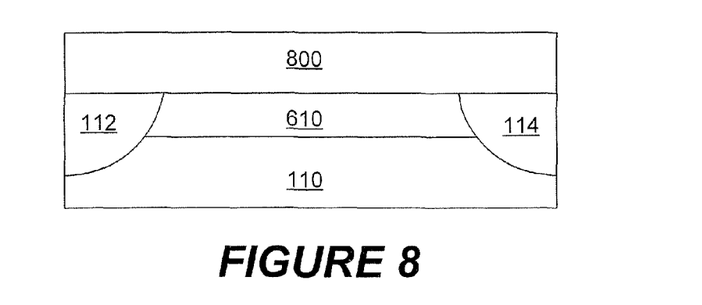
Figure 9:
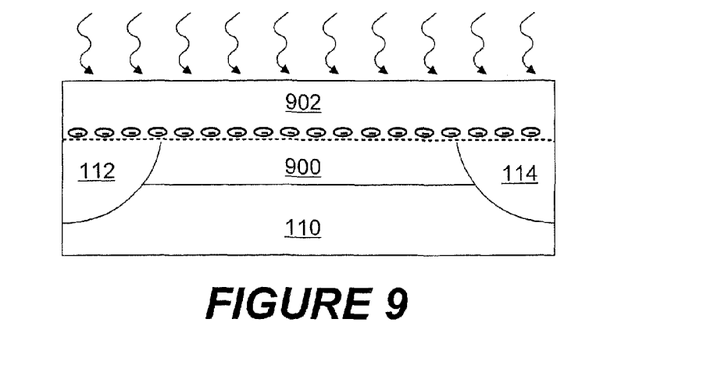

Referring to FIG. 8, a silicon layer 800 is formed across the SiC layer 110 including the channel region 610, such as by depositing a 300 Å thick layer of amorphous silicon. Referring to FIG. 9, the silicon layer 800 is oxidized to form a preliminary silicon dioxide layer 902 and may also result in a small amount of oxidation of the C-terminated SiC layer 110, i.e. along a surface of the buried channel layer 610 in the SiC layer 110. The silicon layer 800 may, for example, be subjected to an oxidizing heat treatment in a dry oxygen ambient at 950° C. for 4.5 hours to form the preliminary silicon dioxide layer 902.

Figure 10:
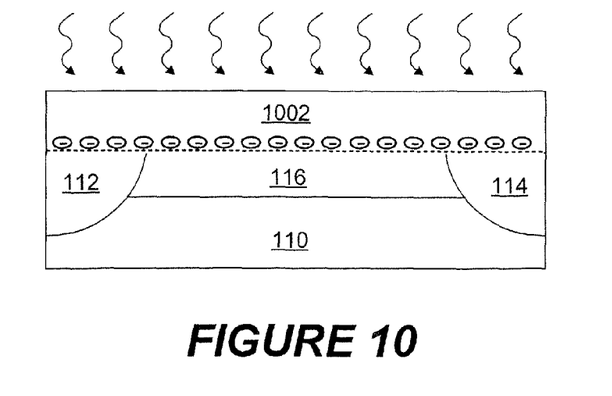

Referring to FIG. 10, the preliminary silicon dioxide layer 902 is subjected to an annealing heat treatment that anneals the preliminary silicon dioxide layer 902 to form an annealed silicon dioxide layer 1002 and that controls the amount of negative charge provided by the annealed $SiO_2$ gate insulation layer 1004 along the interface to the SiC layer 110. The annealing heat treatment may, for example, be carried out in a nitric oxide ambient at a temperature of 1100° C. for 2 hours. The composition of the ambient atmosphere, the temperature, and the duration of the annealing heat treatment can be regulated to control the amount of negative charge provided by the annealed $SiO_2$ gate insulation layer 1002.

Figure 11:
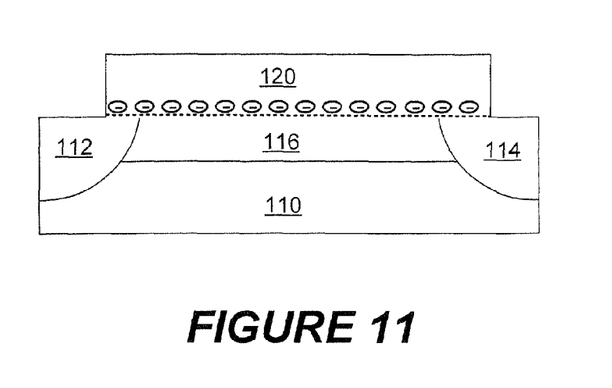

Referring to FIG. 11, the annealed silicon dioxide layer 1002 is patterned, such as by a wet or dry etch process, to form the silicon dioxide gate insulation layer 120.

Figure 12:
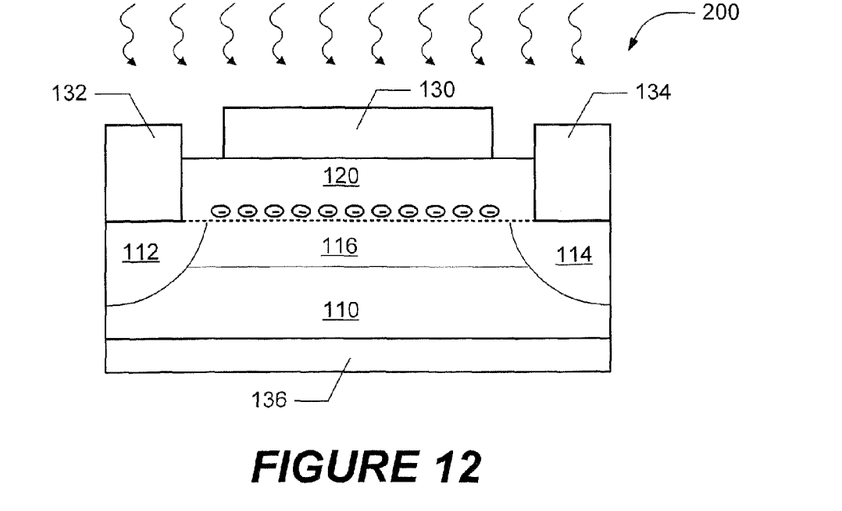

Referring to FIG. 12, a gate contact 130, a source contact 132, and a drain contact 134 are formed by, for example, depositing and then patterning or more layers of nickel or other suitable metal. A body contact 136 is formed on an opposite surface of the SiC layer 110 by, for example, depositing a layer of nickel or other suitable metal.

The resulting structure may be further annealed, such as at 850° C., to improve the ohmic contact between each of the contact structures 130, 132, 134, and 136 and the corresponding regions of the SiC layer 110. The temperature and duration of the annealing process can be regulated to provide a desired net negative charge that is generated along the interface between the $SiO_2$ gate insulation layer 120 and the SiC layer 110. The net negative charge may be controlled to be at least as high as a net charge generated by dopants in an adjacent unit area of the doped channel region 116, which was described above for Equation 1 as being defined by the doping concentration and thickness of the channel region 116.

Figure 13:
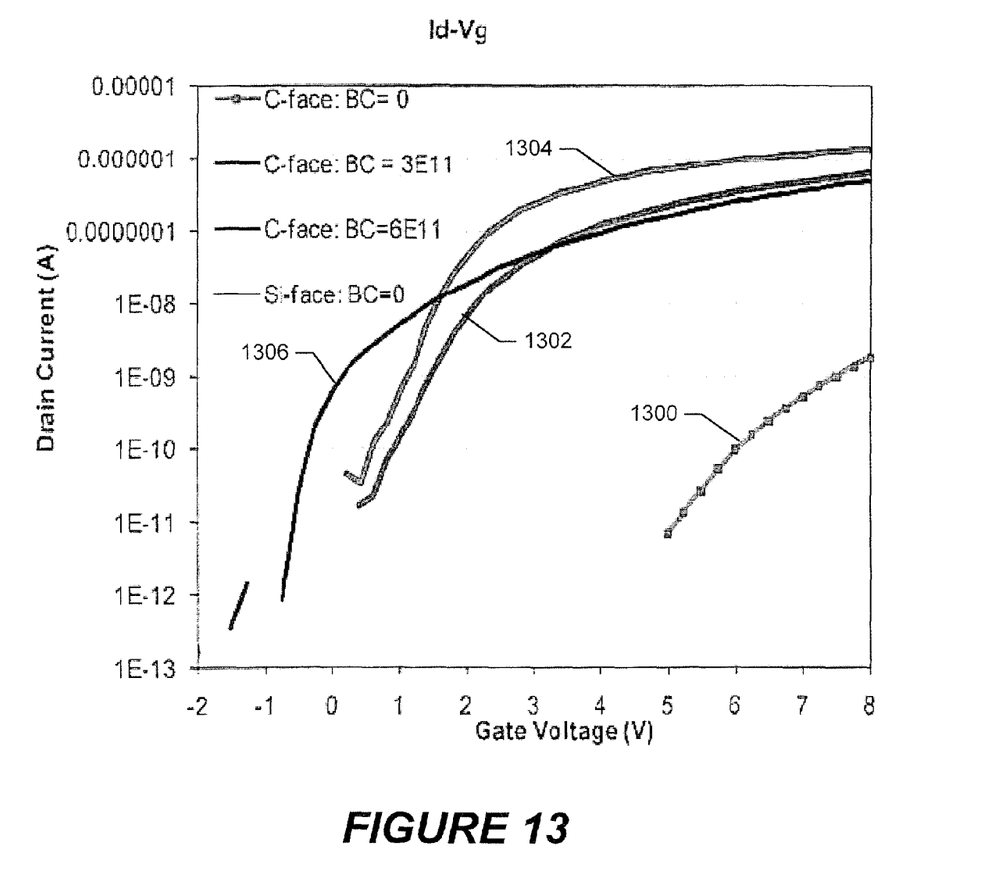
FIG. 13 is a graph that compares the drain current versus gate voltage for various C-face MISFET devices to a Si-face MISFET device.

FIG. 13 is a graph that compares the drain current versus gate voltage for various C-face MISFETs, which are configured in accordance with some embodiments, to a Si terminated SiC MISFET (Si-face MISFET). Referring to FIG. 13, curve 1300 corresponds to a C-face MISFET device without a doped channel region (buried channel (BC)=0), which may correspond to the MISFET 100 of FIG. 1. Curve 1302 corresponds to a C-face MISFET device with a doped channel region having a charge concentration of $3 \times 10^{11}$ cm$^{-2}$, (buried channel (BC)=$3 \times 10^{11}$ cm$^{-2}$), which may correspond to an embodiment of the MISFET 200 of FIG. 2. Curve 1304 corresponds to a C-face MISFET device with a doped channel region have a charge concentration of $6 \times 10^{11}$ cm$^{-2}$, which may correspond to another embodiment of the MISFET 200 of FIG. 2. Curve 1306 corresponds to a Si-face (silicon substrate layer) MISFET device without a doped channel region (BC=0).

Comparing the C-face MISFET of curve 1300 to the Si-face MISFET of curve 1306, it is observed that the negative charge in the $SiO_2$ gate insulation layer of the C-face MISFET increased its threshold voltage (Vth about 5 V) compared to the Si-face MISFET (Vth about −0.8 V). Curves 1302 and 1304 illustrate that increasing the dopant concentration in the doped channel region causes a decrease in the threshold voltage of the Si-face MISFETs, although their threshold voltages remain above 0 V, and causes an increase in the drain current. The negative fixed charge in the $SiO_2$ gate insulation layer can therefore be used to enable the C-face MISFET to be fabricated with a higher dopant concentration in the channel region to increase the channel current capacity while allowing the C-face MISFET to turn off when the gate to source voltage is zero. The negative charge in the $SiO_2$ gate insulation layer may alternatively or additionally be used to increase the threshold voltage of the C-face MISFET.

Figure 14:
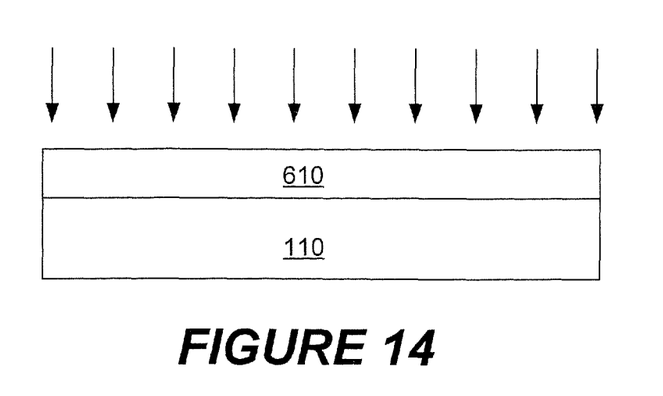
FIGS. 14-19 are a sequence of cross-sectional views of some other processes for fabricating the MISFET of FIG. 2 in accordance with some other embodiments of the present invention.

FIGS. 14-19 are a sequence of cross-sectional views of some other processes that may be carried out to fabricate the MISFET 200 of FIG. 2. Referring to FIG. 14, a SiC layer 110 is provided. A n-type layer 610 is formed in the SiC layer 110 by implanting n-type dopants (e.g., nitrogen and/or phosphorous atoms) at a concentration from about $1 \times 10^{16}$ cm$^{-3}$ to about $1 \times 10^{18}$ cm$^{-3}$ and to a depth from about 0.1 µm to about $0.5 \times 10^{-5}$ µm in the SiC layer 110.

Figure 15:
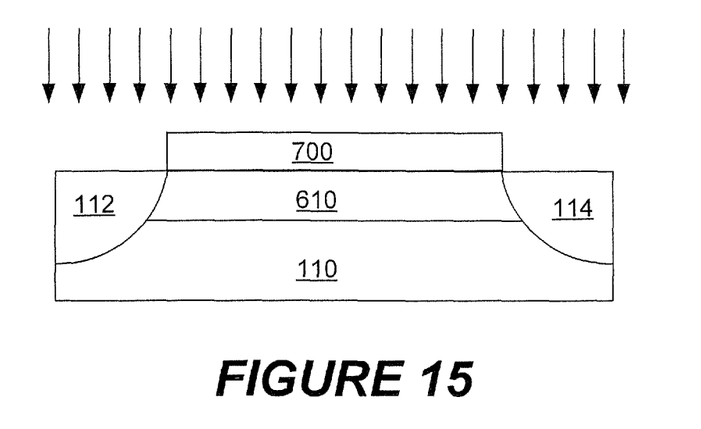

Referring to FIG. 15, a mask pattern 700 is formed on a portion of the n-type layer 610 that will become the doped channel region 116. Further n-type dopants are implanted into the SiC layer 110 to form the n+ source region 112 and the n+ drain region 114 with an n-type dopant concentration from about $1 \times 10^{19}$ cm$^{-3}$ to about $1 \times 10^{21}$ cm$^{-3}$. The implanted dopants may be annealed at a temperature from about 1300° C. to about 2000° C. to form the channel region 116, the source region 112, and the drain region 114. The mask pattern 700 can be removed before or after the annealing. As explained above, a product of the doping concentration and thickness of the channel region 116 should be equal to or less than the amount of negative fixed charge provided by the CSiO$_2$ depletion layer 150 in accordance with some embodiments.

Figure 16:
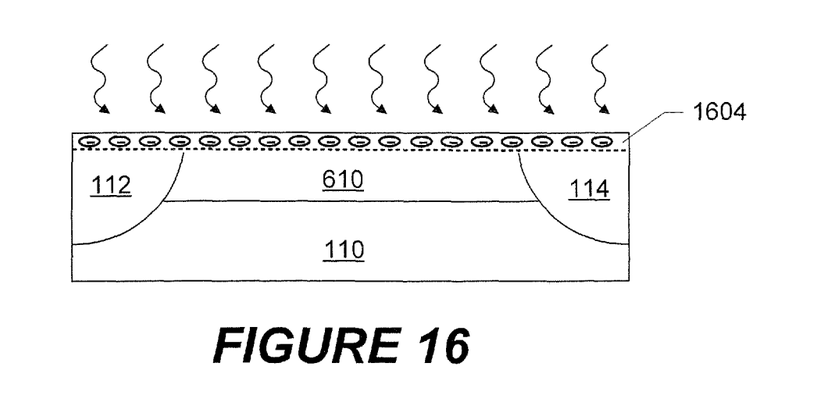

Referring to FIG. 16, a surface of the SiC layer 110 is oxidized, including a surface of the channel region 610, to form a first SiO$_2$ gate insulation layer 1604. The oxidation may be carried-out by heating the SiC layer 110 at a temperature range from about 800° C. to about 1200° C. The temperature and duration of the heating can be controlled to regulate the amount of negative charge generated by the first SiO$_2$ gate insulation layer 1604.

Figure 17:
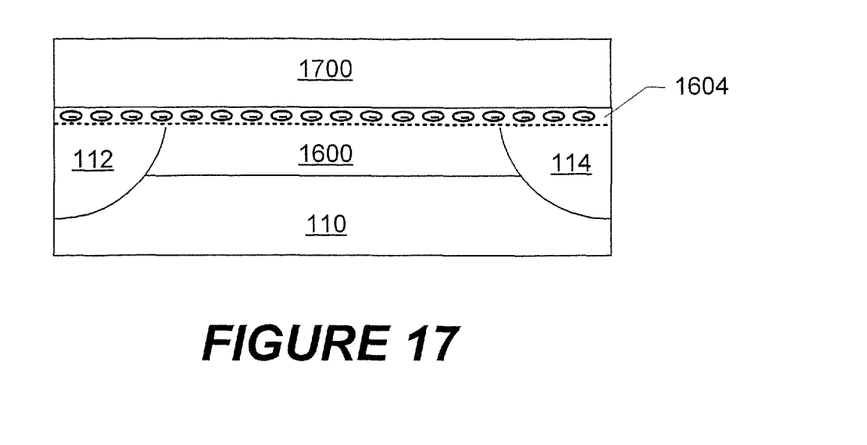
Figure 18:
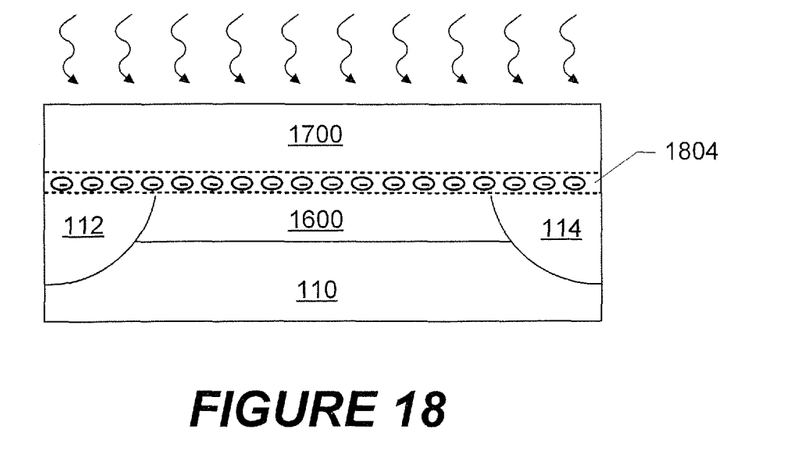

Referring to FIG. 17, a second gate insulation layer 1700 is formed on the first SiO$_2$ gate insulation layer 1604. Referring to FIG. 18, the resulting structure may be subjected to an annealing heat treatment that anneals the first gate insulation layer 1604 to control the amount of negative charge provided along the interface between the first gate insulation layer 1804 and the SiC layer 110. The annealing heat treatment may, for example, be carried out in a nitric oxide ambient at a temperature of 1100° C. for 2 hours. The composition of the ambient atmosphere, the temperature, and the duration of the annealing heat treatment can be regulated to control the net negative charge provided along the interface between the first gate insulation layer 1804 and the SiC layer 110.

Figure 19:
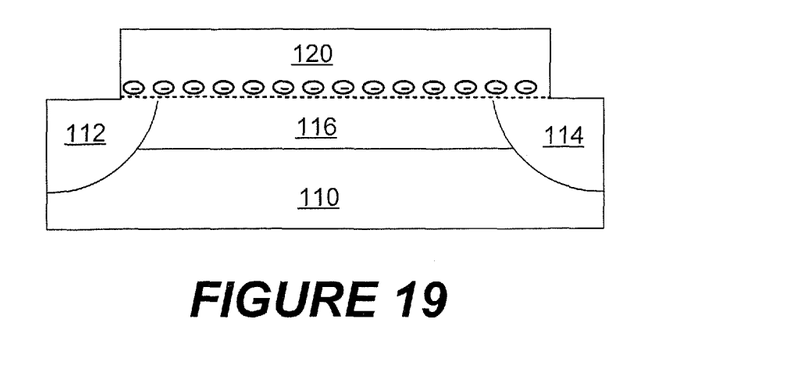

Referring to FIG. 19, the second gate insulation layer 1700 and the first gate insulation layer 1804 are patterned, such as by a wet or dry etch process, to form a multi-layered stacked gate insulation layer 120 between a subsequently formed gate contract and the SiC layer 110.

Other processes described above may be carried out on the resulting structure to provide a gate contact 130, a source contact 132, a drain contact 134, and a body contact 136, as describe above regarding FIGS. 1, 2, and 12, for example. The resulting structure may be further annealed, such as at 850° C., to improve the ohmic contact between each of the contact structures 130, 132, 134, and 136 and the corresponding regions of the SiC layer 110 and to further increase the negative charge along the interface between the gate insulation layer 120 and the SiC layer 110. The temperature and duration of the annealing process can be regulated to provide a desired net negative charge, where the net negative charge may be controlled to be at least as high as a net charge generated by dopants in an adjacent unit area of the doped channel region 116, which was describe above for Equation 1 as being defined by the doping concentration and thickness of the channel region 116.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A metal-insulator-semiconductor field-effect transistor (MISFET) comprising:
   a silicon carbide SiC layer having source and drain regions of a first conductivity type spaced apart therein, the SiC layer comprising a carbon (C)-face, a buried channel region containing first conductivity type impurity atoms extends between the spaced apart source and drain regions in the SiC layer;
   a silicon dioxide layer directly on the C-face of the SiC layer between the source and drain regions, the silicon dioxide layer having a distinct interface along the C-face of the SiC layer that generates a fixed net charge that is the same polarity as majority carriers of the source region and depletes majority charge carriers from an adjacent portion of the buried channel region, wherein a product of a concentration of the first conductivity type impurity atoms in a per unit area and thickness of the buried channel region is equal to or less than an amount of fixed net charge per unit area provided by the silicon dioxide layer; and
   a gate contact on the silicon dioxide layer over the buried channel region of the SiC layer between the source and drain regions.

2. The MISFET of claim 1, wherein the net charge of the silicon dioxide layer depletes the majority charge carriers from the adjacent portion of the channel region when a voltage potential between the gate contact and the source region is zero.

3. The MISFET of claim 1, wherein a region along the interface between the silicon dioxide layer and the SiC layer that provides the fixed net charge has a thickness no greater than 50 Å.

4. The MISFET of claim 1, further comprising a gate insulation layer between the gate contact and the silicon dioxide layer.

5. The MISFET of claim 4, wherein the gate insulation layer comprises silicon nitride.

6. The MISFET of claim 4, wherein the gate insulation layer comprises silicon oxynitride.

7. The MISFET of claim 1, wherein:
   the channel region is an n-type region and the source and drain regions are n+ regions; and
   the silicon dioxide layer has a net negative charge that depletes negative carriers from an adjacent portion of the buried channel region.

8. The MISFET of claim 7, wherein:
   the buried channel region has a n-type dopant concentration of from about $1\times10^{16}$ cm$^{-3}$ to about $1\times10^{18}$ cm$^{-3}$ and a thickness from about 0.1 μm to about $0.5\times10^{-5}$ μm; and
   the source and drain regions each have a n-type dopant concentration from about $1\times10^{19}$ cm$^{-3}$ to about $1\times10^{21}$ cm$^{-3}$.

9. The MISFET of claim 1, wherein:
   the silicon dioxide layer forms the distinct interface along the C-face of the SiC layer that generates a fixed net charge per unit area that is at least as high as a net charge generated by the first conductivity type impurity atoms in an adjacent unit area of the buried channel region when a voltage potential between the gate contact and the source region is zero.

10. The MISFET of claim 1, wherein:
    the carbon (C)-face of the SiC layer, on which the silicon dioxide layer is directly on, is substantially free of silicon atoms.

* * * * *